United States Patent
Kanai et al.

(10) Patent No.: US 8,240,028 B2
(45) Date of Patent: Aug. 14, 2012

(54) NOZZLE MECHANISM, MOUNTING HEAD AND ELECTRONIC COMPONENT MOUNTING APPARATUS

(75) Inventors: Kazunori Kanai, Fukuoka (JP); Hidehiro Saho, Saga (JP); Chikara Takata, Fukuoka (JP); Satoshi Kawaguchi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 770 days.

(21) Appl. No.: 12/294,289

(22) PCT Filed: Mar. 26, 2007

(86) PCT No.: PCT/JP2007/056202
§ 371 (c)(1),
(2), (4) Date: Sep. 24, 2008

(87) PCT Pub. No.: WO2007/111296
PCT Pub. Date: Oct. 4, 2007

(65) Prior Publication Data
US 2009/0056114 A1    Mar. 5, 2009

(30) Foreign Application Priority Data

Mar. 27, 2006 (JP) ................................. 2006-084601

(51) Int. Cl.
*H05K 13/04* (2006.01)
(52) U.S. Cl. ........................................... 29/739; 29/743
(58) Field of Classification Search ............ 29/739–741, 29/743
See application file for complete search history.

(56) References Cited

U.S. PATENT DOCUMENTS

2002/0178578 A1    12/2002  Okamoto et al.
2004/0042890 A1    3/2004  Hirata

FOREIGN PATENT DOCUMENTS

| CN | 1421118 | 5/2003 |
|---|---|---|
| JP | 11068389 A * | 3/1999 |
| JP | 11-145683 | 5/1999 |
| JP | 2002-9491 | 1/2002 |
| JP | 2002-353694 | 12/2002 |
| JP | 2004-88024 | 3/2004 |
| JP | 2004-95718 | 3/2004 |
| WO | 02/26011 | 3/2002 |

OTHER PUBLICATIONS

Machine Translation od JP11068389A, obtained Jul. 26, 2011.*
Patent Cooperation Treaty (PCT) International Preliminary Report on Patentability issued Nov. 27, 2008 in corresponding to International Application No. PCT/JP2007/056202.
Chinese Office Action mailed May 27, 2010 in corresponding Chinese Patent Application No. 200780010610.8.
International Search Report issued Apr. 17, 2007 in the International (PCT) Application of which the present application is the U.S. National Stage.

* cited by examiner

*Primary Examiner* — Livius R Cazan
(74) *Attorney, Agent, or Firm* — Wenderoth, Lind & Ponack, LLP

(57) ABSTRACT

In an electronic component mounting apparatus, nozzle mechanisms are formed slender by providing shaft-type linear motors vertically upward of nozzle units and providing linear encoders vertically upward of the shaft-type linear motors, respectively. Thus, it becomes possible to reduce the occupational area of the individual nozzle mechanisms in XY directions (horizontal direction), thereby allowing the pitch of neighboring nozzles to be narrowed. It also becomes achievable to keep up with increasingly narrow mounting pitches of electronic components on boards of increasingly smaller-size and higher-integration.

3 Claims, 3 Drawing Sheets

NOZZLE MECHANISM, MOUNTING HEAD AND ELECTRONIC COMPONENT MOUNTING APPARATUS

BACKGROUND OF THE INVENTION

1. Technical Field

The present invention relates to a nozzle mechanism, a mounting head and an electronic component mounting apparatus for use in electronic component mounting.

2. Description of the Related Art

As electronic equipment has been advancing toward smaller size and weight and higher functions, circuit boards to be mounted thereon are also in demand for further size reduction and higher, integration. In those boards of the increasingly smaller size and higher integration, since mounting places for electronic component mounting are narrow pitched, there is a demand for narrowing the nozzle pitch also in the mounting head.

Conventionally, the nozzle provided on the mounting head is so formed as to be up/down movable and axially rotatable with respect to the board, where rotational drive of a motor provided at an upper portion of the nozzle is converted into up/down motion of the nozzle by such a drive transfer mechanism such as ball screws and nuts (see JP 2002-9491 A).

SUMMARY OF THE INVENTION

1. Problems to be Solved by the Invention

In order to narrow the nozzle pitch, there is a need to downsize the nozzle mechanism including a servo motor and a drive transfer mechanism for transferring rotational motion of the servo motor to up/down motion of the nozzle. However, the nozzle mechanism serves also as a load mechanism for pressing electronic components sucked and held by the nozzle against the board, and moreover there is a limitation in the downsizing because of the necessity for ensuring an up/down moving speed so that the productivity in electronic component mounting is not lowered.

Accordingly, an object of the present invention, lying in solving these and other issues, is to provide a slender nozzle mechanism corresponding to a narrowed mounting pitch of electronic components, as well as a mounting head having a narrowed nozzle pitch, and further to provide an electronic component mounting apparatus including a mounting head having a narrowed nozzle pitch.

2. Means for Solving the Problems

In order to achieve the above object, according to a first aspect of the present invention, the present invention has the following constitutions.

According to a first aspect of the present invention, there is provided a nozzle mechanism comprising:

a frame;

a nozzle for releasably sucking and holding an electronic component;

a nozzle unit to which the nozzle is rotatably fitted at a lower end thereof and which is provided so as to be movable up/down relative to the frame; and a shaft-type linear motor fixed onto the frame, for moving the nozzle unit up and down relative to the frame; and a linear encoder for detecting an up/down position of the nozzle unit relative to the frame, wherein the shaft-type linear motor is provided vertically upward of the nozzle unit, and the linear encoder is provided vertically upward of the shaft-type linear motor.

According to a second aspect of the present invention, there is provided a mounting head for mounting electronic components sucked and held to a plurality of nozzles, respectively, to a plurality of mounting places in a board, the mounting head comprising:

a frame;

a plurality of nozzle units to which the nozzles are rotatably fitted at lower ends thereof, respectively, and which are provided so as to be movable up/down relative to the frame;

a plurality of shaft-type linear motors fixed onto the frame, for moving the individual nozzle units up and down, independently of one another, relative to the frame; and a plurality of linear encoders for detecting up/down positions of the individual nozzle units relative to the frame, wherein the shaft-type linear motors are provided vertically upward of the nozzle units, and the linear encoders are provided vertically upward of the shaft-type linear motors.

According to a third aspect of the present invention, there is provided an electronic component mounting apparatus including a mounting head which is provided so as to be horizontally movable relative to an electronic component feeding unit and a board holding unit, and which sucks and holds, by a plurality of nozzles, a plurality of electronic components accommodated in the electronic component feeding unit and mounts the individual electronic components to a plurality of mounting places in a board held by the board holding unit, respectively, the mounting head comprising:

a frame;

a plurality of nozzle units to which the nozzles are rotatably fitted at lower ends thereof, respectively, and which are provided so as to be movable up/down relative to the frame;

a plurality of shaft-type linear motors fixed onto the frame, for moving the individual nozzle units up and down, independently of one another, relative to the frame; and a plurality of linear encoders for detecting up/down positions of the individual nozzle units relative to the frame, wherein the shaft-type linear motors are provided vertically upward of the nozzle units, and the linear encoders are provided vertically upward of the shaft-type linear motors.

According to a fourth aspect of the present invention, there is provided the electronic component mounting apparatus as defined in the third aspect, wherein the individual nozzle units are set up on the frame with placement intervals equal to placement intervals of the plurality of electronic component feeders included in the electronic component feeding unit.

3. Effects of the Invention

According to the present invention, since nozzles can be arrayed at a narrow pitch, there can be realized nozzle mechanism, a mounting head and an electronic component mounting apparatus suitable for mounting of electronic components onto boards which have been increasingly narrowing in pitch by smaller sizes and higher integrations.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION. OF THE INVENTION

Figure 1:
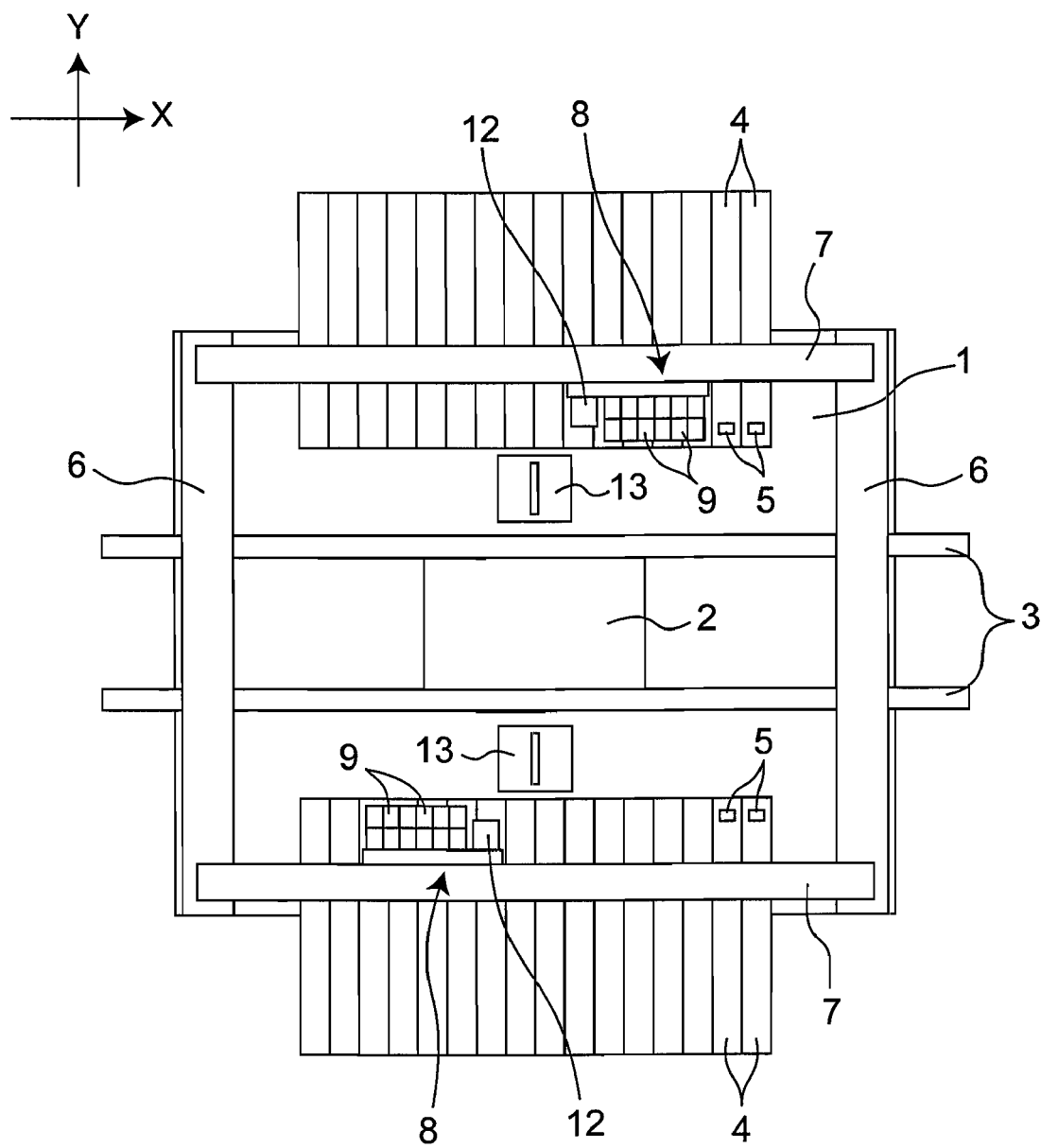
FIG. 1 is an overall constructional view of an electronic component mounting apparatus according to an embodiment of the invention.

Before the description of the present invention proceeds, it is to be noted that like parts are designated by like reference numerals throughout the accompanying drawings.

Hereinbelow, an embodiment of the present invention will be described in detail with reference to the accompanying drawings.

First, the overall construction of an electronic component mounting apparatus according to the embodiment of the invention is explained. FIG. 1 shows an overall constructional view of the electronic component mounting apparatus of the embodiment. In FIG. 1, on a base 1 of the electronic component mounting apparatus, a board conveyance unit 3 for conveying a board 2 is provided so as to extend in an X direction. The board conveyance unit 3, having a function of clamping and holding the board 2, functions as a board holding unit for holding the board 2, which is conveyed in the X direction, at a specified position. It, is noted that in this embodiment, the direction of conveyance of the board 2 is taken as the X direction, a direction perpendicular to the X direction within a horizontal plane is taken as a Y direction, and a direction vertical to the X and Y directions is taken as a Z direction.

On both sides of the board conveyance unit 3 in the Y direction, a plurality of component feeders 4, as one example of the feeder for feeding of electronic components, are provided in parallel. The component feeders 4, functioning as an electronic component feeding unit, feed plurality of electronic components stored therein one by one to each feed port 5.

A pair of Y tables 6 is provided on both end portions of the base 1 in the X direction, and X tables 7 are installed on the pair of Y tables 6. A mounting head 8 is set on the X tables 7. A Y-axis drive mechanism 6a and an X-axis drive mechanism 7a (see, e.g., FIG. 3) are provided for the Y tables 6 and the X tables 7, respectively, so as to horizontally move the mounting head 8 relative to the base 1.

Figure 2:
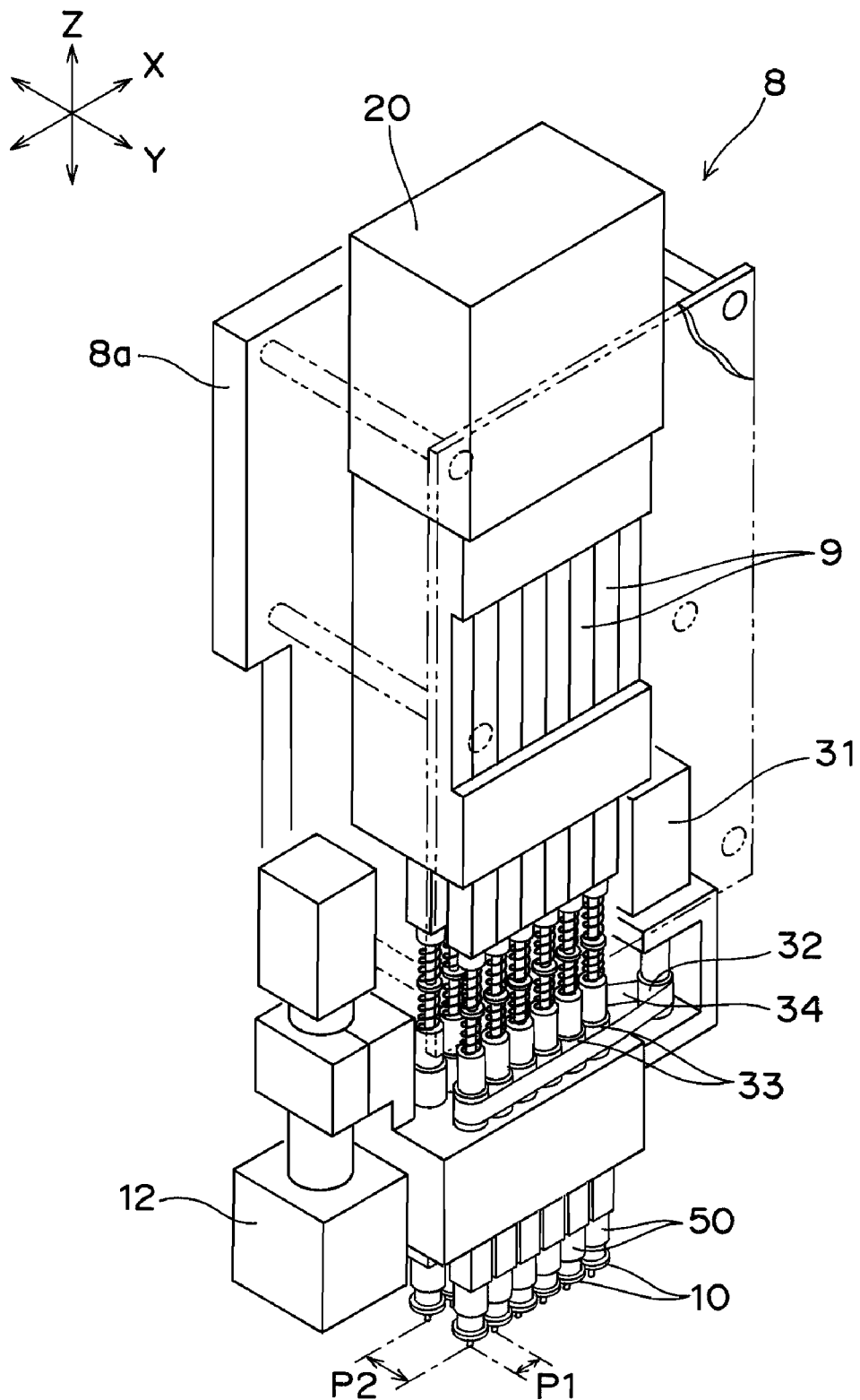
FIG. 2 is a perspective view of the mounting head of the embodiment.

FIG. 2 shows a perspective view of the mounting head of this embodiment. In FIG. 2, the mounting head 8 is fitted to the X tables 7 with a bracket 8a. On the bracket 8a is fitted a frame 20 that holds a plurality of nozzle mechanisms 9 at specified intervals (in this embodiment, a total of twelve nozzle mechanisms, six arrays in the X direction and two arrays in the Y direction, are fitted). A nozzle 10 for releasably sucking and holding an electronic component is fitted at a lower end of each of the nozzle mechanisms 9. Each of the nozzle mechanisms 9 has a θ-rotation mechanism 30 for rotating the nozzle 10 along a θ direction (around the Z axis). The θ-rotation mechanism 30 is formed of a mechanism that transfers drive of the motor 31 to rotation of the corresponding nozzles 10 by a timing belt 34 which is fitted to a pulley 32 directly connected to a motor 31 and pulleys 33 directly connected to the nozzles 10. In addition, although not shown, the θ-rotation mechanism is made up on a basis that six arrays of the nozzle mechanisms 9 arrayed in the X direction are taken as one set, where two θ-rotation mechanisms are provided in this embodiment.

Figure 3:
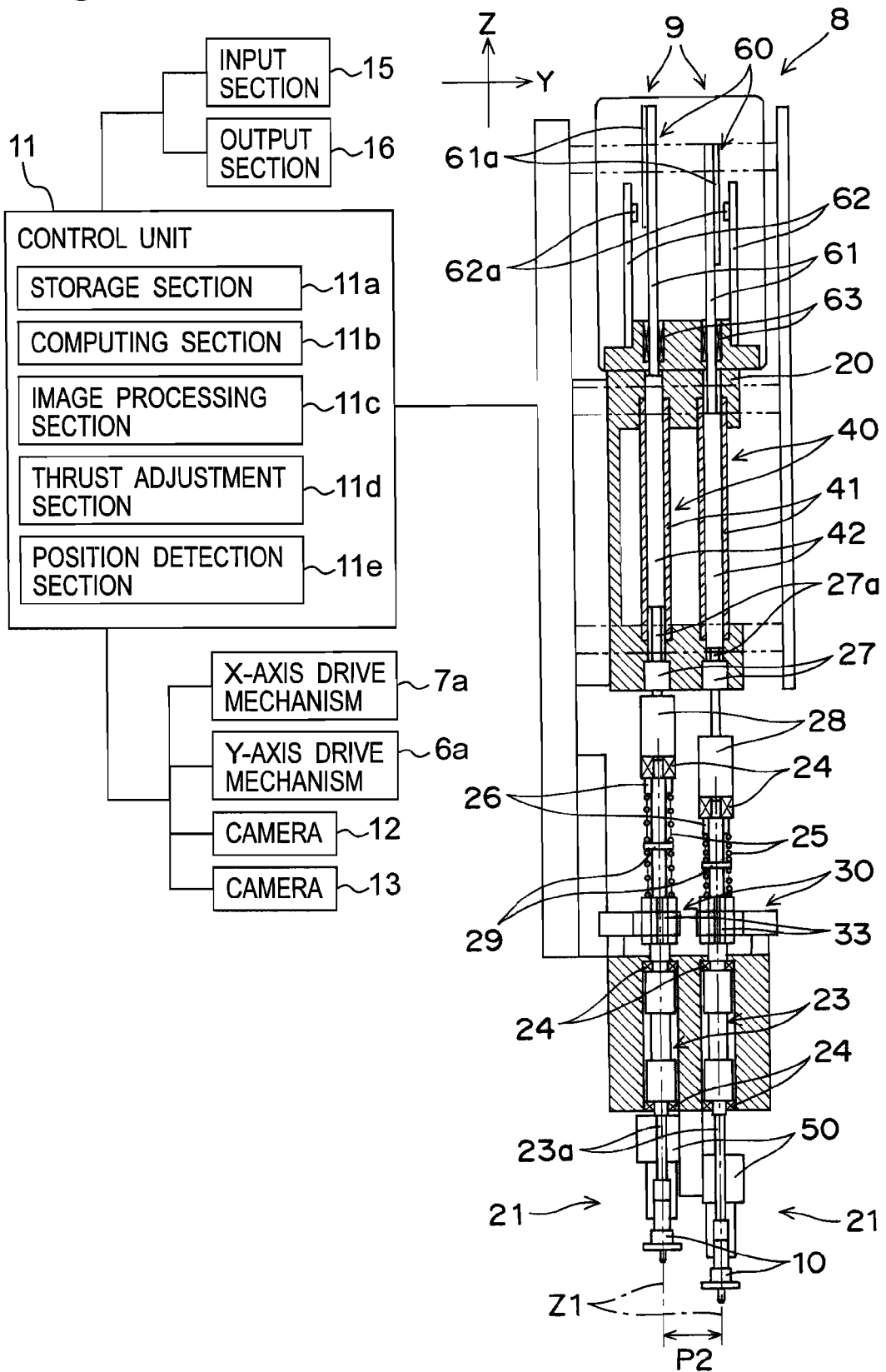
FIG. 3 is a side view of the nozzle mechanism as well as a constructional view of the control system in the embodiment.

Also, each nozzle mechanism 9 has a Z-axis drive mechanism 40 for moving the nozzle 10 up and down. Further, each nozzle mechanism 9, having a suction-and-exhaust mechanism 50, sucks and holds an electronic component by vacuum suction from inside of the nozzle 10 by drive of a vacuum generation source (not shown), and releases the electronic component, i.e. so-called vacuum break, by exhaustion of the inside of the nozzle 10. As shown in FIG. 3, the Y-axis drive mechanism 6a, the X-axis drive mechanism 7a, the θ-rotation mechanism 30, the Z-axis drive mechanism 40 and the suction-and-exhaust mechanism 50 are electrically and controllably connected to a control unit 11 so as to be driven according to control commands transmitted from the control unit 11.

Referring to FIGS. 1 and 2, beside the mounting head 8 is provided a camera 12. The camera 12 horizontally moves along the XY directions relative to the base 1 integrally with the mounting head 8, functioning as an image pickup means for performing image pickup of a recognition object. Further, a camera 13 is also provided between the board conveyance unit 3 and the component feeder 4. The camera 13 functions as an image pickup means for scanning, from below, an electronic component picked up by the nozzle 10 from the feed port 5 of the component feeder 4.

FIG. 3 houses a side view of the nozzle mechanism as well as a constructional view of the control system in this embodiment. In FIG. 3, an image of a recognition object picked up by the camera 12 is subjected to image processing by an image processing section 11c included in the control unit 11, and a horizontal position relationship between a center of the recognition object and a recognition origin of the camera 12 is computed by a computing section 11b. Distance data between the recognition origin of the camera 12 and axial centers of the individual nozzles 10 have preliminarily been stored in a storage section 11a, and the horizontal position relationship between the axial center of an arbitrary nozzle 10 of the mounting head 8 and the center of the recognition object is computed by the computing section 11b. The control unit 11 controls the drive of the Y-axis drive mechanism 6a and the X-axis drive mechanism 7.b based on a computation result by the computing section 11b, by which the axial center of the arbitrary nozzle 10 and the center of the recognition object is aligned with each other. It is noted that the recognition object by the camera 12 is an electronic component fed to the feed port 5 of the component feeder 4 in a pickup process, and a recognition mark or the like for positional alignment is provided at a specified site of the board 2. An image of the recognition object picked up by the camera 13 is subjected to image processing by the image processing section 11c, and a horizontal position relationship between the center of the recognition object and the recognition origin of the camera 13 is computed by the computing section 11b. The recognition object by the camera 13 is normally an electronic component sucked to the nozzle 10, and the mounting head 8 is so positioned that the axial center of the nozzle 10 that has picked up the recognition-object electronic component overlaps with the recognition origin of the camera 13 on the picked-up image. Accordingly, the horizontal position relationship between the center of the electronic component and the recognition origin of the camera 13 computed by the computing section 11b represents a difference between the axial center of the nozzle 10 and the center of the electronic component. The control unit 11 controls the drive of the Y-axis drive mechanism 6a and the X-axis drive mechanism 7b based on the computation result by the computing section 11b. By this control, the electronic component sucked to the nozzle 10 is corrected in positional alignment accurately to a mounting position. Further, the image processing section 11c performs pattern recognition of the image of the electronic component to do posture recognition of the electronic component sucked to the nozzle 10. The computing section 11b computes a difference between the posture of the electronic component sucked to the nozzle 10 and a normal mounting posture. The control unit 11 controls the drive of the θ-rotation mechanism 30 based on a computation result by the computing section 11b. By this control, the posture of the electronic component sucked by the nozzle 10 is corrected for normal mounting posture.

To the control unit 11, an input section 15 implemented by a keyboard, driver or the like is connected to perform input of various data to be preparatorily stored in the storage section 11a, or direct input of commands to the control unit 11. Further, an output section 16 is connected to the control unit 11. The output section 16 includes a visible display means such as CRT or liquid crystal panel for visualizing and displaying an operating status in the electronic component mounting apparatus. The output section 16 further has an alarm means to notify an operator of error information upon occurrence of failures during the operation of the apparatus or the like.

The computing section 11b further performs various types of computation processing in the electronic component mounting apparatus. Data necessary for computation processing are preliminarily stored in the storage section 11a. As a control program is further stored in the storage section 11a, the control unit 11 controls mounting operations in the electronic component mounting apparatus according to the control program.

Next, the nozzle mechanism in the embodiment of the invention is explained. Referring to FIG. 3, the nozzle mechanisms 9 are held at specified intervals in the frame 20. Each of the nozzle mechanisms 9 includes a nozzle unit 21 with a nozzle 10 fitted to its lower end, a Z-axis drive mechanism 40 for moving the nozzle 10 up and down relative to the frame 20, a θ-rotation mechanism 30 for rotating the nozzle 10 along a θ direction (around the Z axis), a suction-and-exhaust mechanism 50 for performing suction and exhaustion inside the nozzle 10 to pick up and release an electronic component, and a linear encoder 60 for detecting an up/down position of the nozzle unit 21 relative to the frame 20.

The nozzle unit 21 is formed primarily of a ball spline 23, which is supported by a bearing 24 so as to be rotatable along the θ direction (around the Z axis). The nozzle 10, which is fitted to a lower end of a spline shaft 23a, moves by interlocking with sliding of the spline shaft 23a in the Z direction so as to be displaced up and down relative to the frame 20. A coil spring 25 is fitted around the spline shaft 23a, where an upper end of the coil spring 25 is engaged with an engagement portion 26 formed at an upper end portion of the spline shaft 23a. A lower end of the coil spring 25 is engaged with, for example, the pulley 33 so as to be fixed relative to the frame 20. As in the nozzle mechanism 9 on the left hand side as shown in FIG. 3, when no external force acts on the spline shaft 23a, the spline shaft 23a and the nozzle 10 fitted thereto are biased upward by elastic force of the coil spring 25. Meanwhile, as in the nozzle mechanism on the right hand side as shown in FIG. 3, when a force acts to press the spline shaft 23a downward, the spline shaft 23a and the nozzle 10 move downward against the elastic force of the coil spring 25. The coil spring 25 functions as a biasing means for biasing the nozzle 10 upward relative to the frame 20.

In the θ-rotation mechanism 30, the pulley 33 is contrived so as to be thinner in wall thickness. Normally, such a pulley is provided in such a structure so that the pulley is fixed to the spline shaft by being tightened from its outer circumferential side. However, in the nozzle mechanism 9 of this embodiment, which is aimed at thinning the pulley 33, the pulley 33 is sandwiched from above and below so as to be fixed to the spline shaft 23a. By such a fixing method adopted, a substantial outer-circumferential end diameter of the pulley 33 can be made smaller, which can contribute to narrowing of the placement pitch of the nozzles 10 as will be described later.

In addition, when the coil spring has an excessively large spring length relative to its coiling diameter, the coil spring becomes more likely to buckle in a compression process, which may cause the occurrence of a failure due to the buckled spring portion interfering with other portions. Due to this, the coil spring 25 is divided into two-stages in the Z direction by a spacer 29, so that enough spring length is ensured without enlarging the coiling diameter. As a result, with neighboring nozzle mechanisms 9 placed in proximity to each other, mutual interference between buckled coil springs 25 can be prevented.

Vertically upward of the nozzle unit 21, a shaft-type linear motor forming the Z-axis drive mechanism 40 is provided. The shaft-type linear motor 40 includes a stator 41 fixed to the frame 20, and a mover 42 which is freely slidable up and down relative to the stator 41. In the mover 42, S poles and N poles of permanent magnets are alternately arrayed at specified intervals, so that current conduction through a coil contained in the stator 41 causes a thrust for moving the mover 42 in the Z direction to be generated. Between the nozzle unit 21 and the shaft-type linear motor 40 is provided a ball spline 27 serving as a transfer means for transferring the thrust of the mover 42 to the spline shaft 23a, where a lower end of the mover 42 is connected to an upper end of a spline shaft 27a of the ball spline 27.

When a downward thrust is generated in the mover 42, the spline shaft 27a connected to the mover 42 is moved vertically downward, applying a pressing force to the upper end of the spline shaft 23a via a connector 28. As this pressing force goes beyond the elastic force of the coil spring 25, the spline shaft 23a moves downward, so that the nozzle 10 fitted to the lower end of the spline shaft 23a is moved downward relative to the frame 20. In the control unit 11, a thrust adjustment section 11d is included, so that by regulating the current to be passed through the coil to control the thrust of the nozzle 10, up/down position of the nozzle 10 relative to the frame 20 is adjusted. It is noted that the connector 28, which presses the nozzle unit 21 downward by making contact with the bearing 24 that supports the upper end of the spline shaft 23a, is never affected by the rotation of the ball spline 23.

Vertically upward of the shaft-type linear motor 40 is provided a linear encoder 60. The linear encoder 60 includes a movable part 61 and a stationary part 62. The movable part 61 is inserted into a bearing 63, which is provided on the frame 20, so as to be up-and-down movable in the Z direction and connected to an upper end of the mover 42, so that the movable part 61 is enabled to move up and down in linkage with up/down movement of the mover 42. The stationary part 62 is fixed to the frame 20 and changeable in up/down position relative to the movable part 61, which is up/down movable in linkage with up/down movement of the mover 42. A change amount of this up/down positional change is detected by a process in which an electric signal resulting from detection of a detected part 61a provided in the movable part 61 is detected by a detecting head 62a provided in the stationary part 62 is processed in a position detection section 11e included in the control unit 11. As a result, an up/down position of the movable part 61 relative to the frame 20, i.e., an up/down position of the nozzle 10 relative to the frame 20, is detected.

In addition, since the mover 42 is restricted in displacement in the θ direction by the ball spline 27, the movable part 61 connected to the mover 42 is also restricted in displacement in the θ direction and therefore allowed to be displaced only in the Z direction. Accordingly, even when the movable part 61 is moved up or down to any position in the Z direction, the detected part 61a provided in the movable part 61 is maintained normally opposed to the detection head 62a provided in the stationary part 62, so that an up/down position of the nozzle 10 relative to the frame 20 can be detected.

The control unit 11 performs adjustment of the thrust of the mover 42 based on an up/down position of the nozzle 10 relative to the frame 20. That is, in order to improve the throughput, or improve the productivity, it is necessary to enhance the up/down move speed of the nozzle 10. Meanwhile, for suction-and-hold or mounting of an electronic component by the nozzle 10, move-down speed of the nozzle 10 needs to be lowered to reduce the impact on the electronic component or the board. Therefore, at time points when the lower end of the nozzle 10 has come close to a specified position with respect to the electronic component and when the electronic component sucked by the nozzle 10 has come to a specified position with respect to a mounting place on the board, the thrust of the mover 42 is lowered so that the move-down speed of the nozzle 10 is lowered. In this way, the up/down speed of the nozzle 10 is controlled based on the up/down position of the nozzle 10 relative to the frame 20, by which the mounting quality can be maintained without lowering the throughput. Also, since the nozzle 10 is biased upward relative to the frame 20 by the coil spring 25, an interruption or a halt of conduction through the coil contained in the mover 42 causes the thrust acting on the mover 42 to become zero, which may lead to a case where only the elastic force by the coil spring 25 acts so that the nozzle 10 abruptly rises. This may result in the occurrence of such failures as a fall of the electronic component sucked by the nozzle 10 or an impact applied to each drive system. For this reason, an electric circuit for delaying the interruption of conduction to the mover 42 is provided in the control unit to exert such control so that the thrust of the mover 42 gradually lowers from a time point of interruption of conduction.

As shown above, the nozzle mechanism 9 in this embodiment has such a structure that the shaft-type linear motor 40 is provided vertically upward of the nozzle unit 21 while the linear encoder 60 is provided vertically upward of the shaft-type linear motor 40, hence the mechanism is formed so as to be more slender. Adopting such a structure makes it possible to scale down the occupational area in the XY directions (horizontal direction). In particular, the linear encoder for detecting changes in relative position in the vertical direction is capable of slimming down to a large extent, as compared with a rotary encoder for detecting a rotational angle of a servo motor in a conventional nozzle mechanism using a combination of the servo motor and a ball screw or other like transfer mechanisms. Accordingly, a pitch P1 of the nozzles 10 in the X direction as well as a pitch P2 thereof in the Y direction (see FIGS. 2 and 3) can be narrowed to a larger extent, compared with conventional ones. As a result, there can be realized a mounting head in which the nozzles 10 are arrayed at pitches corresponding to mounting places of increasingly narrowing pitches of boards that have been going smaller in size and higher in integration.

For instance, whereas the pitch P1 of the nozzles in the X direction in conventional mounting heads is 21 mm, the pitch P1 in this embodiment can be made as narrow as 10.5 mm, half the conventional one. As to the component feeders, it has been practiced to use a double feeder (one component feeder in which two feed ports are placed in the widthwise direction) with a view to increasing the number of component types to be mounted. However, in spite of the use of such a double feeder, because it has been impossible to narrow the nozzle pitch in mounting heads, there are limitations in combinations of feeders capable of simultaneous suction and hold. That is, there exists an issue that electronic components could not be erected simultaneously from the individual feed ports in one double feeder. Conversely, in this embodiment, since the nozzle pitch can be narrowed, it becomes implementable to set the nozzle pitch to match the pitch of the double feeder. In such a case, it becomes implementable to simultaneously suck and extract electronic components from the individual feed ports of one double feeder, so that the productivity in electronic component mounting can be improved.

Also, in a case where the component feeder 4 (see FIG. 1) is a double feeder capable of simultaneously feeding two electronic components, it becomes implementable to set the pitch P2 of the nozzles 10 in the Y direction to match a pitch of two electronic components in the Y direction to be fed to the feed ports 5 (see FIG. 1) of the component feeder 4, so that simultaneous pickup of two components becomes implementable, making it achievable to improve the throughput.

Further, by virtue of direct use of the thrust of the linear motor for up/down movement of the nozzles 10, it becomes possible to directly adjust up/down movement amounts of the nozzles 10, compared with the conventional method in which rotational motion is transferred to linear motion, so that direct load control in electronic component mounting can be implemented. That is, in such a structure as in conventional mounting heads in which a ball screw mechanism is used as a drive transfer mechanism; there is a need to adjust the accuracy of up/down movement of the nozzles in consideration of errors of thread groove pitches. In this embodiment, by contrast, there is no intervention of any drive transfer mechanism unlike the conventional cases, and up/down movement amounts are determined directly in the linear motor 40, so that the up/down moving accuracy is determined by the accuracy of the linear encoder 60.

In this embodiment also, since the direct up/down movement of the nozzles 10 is implemented by the shaft-type linear motor 40 without intervention of any drive transfer mechanism unlike conventional cases, it becomes implementable to reduce the weight and size of the nozzle mechanism 9.

According to the present invention, since it becomes possible to array the nozzles at narrower pitches, the invention is useful in fields involving electronic component mounting onto boards of increasingly smaller sizes and higher integrations.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2006-084601 filed on Mar. 27, 2006, including specification, claims, and drawings is incorporated herein by reference in its entirety.

The invention claimed is:

1. A mounting head for mounting electronic components to a plurality of mounting places on a board, the mounting head comprising:
 a frame;
 a plurality of nozzle units to which a plurality of nozzles are rotatably fitted at lower ends thereof, respectively, and which are provided so as to be movable up/down relative to the frame;
 a plurality of shaft-type linear motors fixed onto the frame, for moving the individual nozzle units up and down, independently of one another, relative to the frame;
 a plurality of linear encoders for detecting up/down positions of the individual nozzle units relative to the frame; and
 a rotating unit for rotationally driving the individual nozzle units, wherein:
 the shaft-type linear motors are provided vertically upward of the nozzle units, and the linear encoders are provided vertically upward of the shaft-type linear motors,
 each of the shaft-type linear motors includes a stator fixed to the frame, and a mover slidable up and down relative to the stator,
 each of the linear encoders includes a movable part connected to the mover of one of the shaft-type linear motors, and a stationary part that detects an up/down position of the movable part, the stationary part being fixed to the frame, and
 the mounting head further comprises a plurality of restricting members for coupling the shaft-type linear motors and the nozzle units to each other, respectively, and transferring driving force for up/down movement by the shaft-type linear motors to the nozzle units, and restricting rotational-direction movement of the movers of the shaft-type linear motors caused by rotational driving of the nozzle units by the rotating unit thereby restricting rotational-direction moving of the movable parts of the linear encoders.

2. An electronic component mounting apparatus including a mounting head which is provided so as to be horizontally movable relative to an electronic component feeding unit and a board holding unit, and which sucks and holds, by a plurality of nozzles, a plurality of electronic components accommodated in the electronic component feeding unit and mounts the individual electronic components to a plurality of mounting places on a board held by the board holding unit, respectively,
 the mounting head comprising:
 a frame;
 a plurality of nozzle units to which the nozzles are rotatably fitted at lower ends thereof, respectively, and which are provided so as to be movable up/down relative to the frame;
 a plurality of shaft-type linear motors fixed onto the frame, for moving the individual nozzle units up and down, independently of one another, relative to the frame;
 a plurality of linear encoders for detecting up/down positions of the individual nozzle units relative to the frame; and
 a rotating unit for rotationally driving the individual nozzle units, wherein:
 the shaft-type linear motors are provided vertically upward of the nozzle units, and the linear encoders are provided vertically upward of the shaft-type linear motors,
 each of the shaft-type linear motors includes a stator fixed to the frame, and a mover slidable up and down relative to the stator,
 each of the linear encoders includes a movable part connected to the mover of one of the shaft-type linear motors, and a stationary part that detects an up/down position of the movable part, the stationary part being fixed to the frame, and
 the mounting head further comprises a plurality of restricting members for coupling the shaft-type linear motors and the nozzle units to each other, respectively, and transferring driving force for up/down movement by the shaft-type linear motors to the nozzle units, and restricting rotational-direction movement of the movers of the shaft-type linear motors caused by rotational driving of the nozzle units by the rotating unit thereby restricting rotational-direction movement of the movable parts of the linear encoders.

3. The electronic component mounting apparatus as defined in claim 2, wherein the individual nozzle units are set up on the frame with placement intervals equal to placement intervals of the plurality of electronic component feeders included in the electronic component feeding unit.

* * * * *